United States Patent [19]
Litwin et al.

[11] Patent Number: 6,100,770
[45] Date of Patent: Aug. 8, 2000

[54] MIS TRANSISTOR VARACTOR DEVICE AND OSCILLATOR USING SAME

[75] Inventors: Andrej Litwin, Danderyd; Sven Erik Mattisson, Bjärred, both of Sweden

[73] Assignee: Telefonaktiebolaget LM Ericsson (publ), Stockholm, Sweden

[21] Appl. No.: 09/150,231

[22] Filed: Sep. 9, 1998

[30] Foreign Application Priority Data

Sep. 11, 1997 [SE] Sweden ................................. 9703295

[51] Int. Cl.[7] .......................... H01L 29/93; H01L 29/94; H03B 5/12
[52] U.S. Cl. .................................. 331/117 FE; 257/312; 257/598; 257/601; 331/177 V; 438/379
[58] Field of Search ..................................... 257/312, 595, 257/598, 601; 438/379; 331/117 FE, 177 V

[56] References Cited

U.S. PATENT DOCUMENTS

| | | | |
|---|---|---|---|
| 3,878,482 | 4/1975 | Schowe, Jr. | 331/108 D |
| 3,904,988 | 9/1975 | Hsiao | 331/111 |
| 4,247,826 | 1/1981 | Gappa et al. | 330/264 |
| 4,360,790 | 11/1982 | Heise | 331/114 |
| 4,450,416 | 5/1984 | Mears | 331/117 FE |
| 4,529,995 | 7/1985 | Sakai et al. | 357/14 |
| 4,692,717 | 9/1987 | Ouyang et al. | 331/111 |
| 4,853,655 | 8/1989 | Embree et al. | 331/116 FE |
| 4,887,053 | 12/1989 | Embree et al. | 331/116 FE |
| 4,947,140 | 8/1990 | Tateishi | 331/113 R |
| 5,045,966 | 9/1991 | Alter | 361/313 |
| 5,061,907 | 10/1991 | Rasmussen | 331/57 |
| 5,107,227 | 4/1992 | Brooks | 331/8 |

(List continued on next page.)

FOREIGN PATENT DOCUMENTS

| | | |
|---|---|---|
| 0 208 935 A1 | 1/1987 | European Pat. Off. |
| 0657993 A1 | 6/1995 | European Pat. Off. |
| 0720185 A1 | 7/1996 | European Pat. Off. |
| 2 541 514 | 8/1984 | France. |
| 2679702 A1 | 1/1993 | France. |
| 06132728 | 5/1994 | Japan. |
| 9093124 | 4/1997 | Japan. |
| 2138206 | 10/1984 | United Kingdom. |

OTHER PUBLICATIONS

*A 1.8–Ghz Low–Phase–Noise CMOS VCO Using Optimized Hollow Spiral Inductors* by Jan Craninckx, Student Member, IEEE and Michiel S.J. Steyaert, Senior Member, IEEE, IEEE Journal of Solid–State Circuits, vol. 32, No. 5, May 1997, pp. 736–744.

*Integrated RF and Microwave Components in BiCMOS Technology* by Joachim N. Burghartz, Senior Member, IEEE, Mehmet Soyuer, Member IEEE and Keith A. Jenkins, IEEE Transaction on Electron Devices, vol. 43, No. 9, Sep. 1996, pp. 1559–1570.

*Ion–Implanted Hyperabrupt Junction Voltage Variable Capacitors* by R.A. Moline, Member, IEEE, and G.F. Foxhall, Senior Member, IEEE Transactions on Electron Devices, vol. ED–19, No. 2, Feb. 1972, pp. 267–273.

*Voltage Variable Capacitor Tuning: A Review* by Marcus H. Norwood, Member, IEEE, and Ephraim Shatz, Proceedings of the IEEE, vol. 56, No. 5, May 1968, pp. 788–798.

*Primary Examiner*—Siegfried H. Grimm
*Attorney, Agent, or Firm*—Jenkens & Gilchrist, P.C.

[57] ABSTRACT

An electrical device having a voltage dependent capacitance is provided comprising a first region of a semiconductor material, and a second region and a third region of a semiconductor material formed in the first region, the second and third regions being separated by a separation region, and an electrically insulating layer formed on the first region at least at a region corresponding to the separation region, and a substantially conductive element formed on the insulating layer at least at a region corresponding to the separation region such that the insulating layer electrically insulates the substantially conductive element from the first, second and third regions, and a first electrode connected to the substantially conductive element, and a second electrode and third electrode are connected to the second and third regions. A method of manufacturing the device is also disclosed.

34 Claims, 6 Drawing Sheets

U.S. PATENT DOCUMENTS

| | | | |
|---|---|---|---|
| 5,173,835 | 12/1992 | Cornett et al. | 257/310 |
| 5,175,512 | 12/1992 | Self | 331/57 |
| 5,218,325 | 6/1993 | Trelewicz et al. | 331/117 FE |
| 5,300,898 | 4/1994 | Chen et al. | 331/57 |
| 5,365,204 | 11/1994 | Angiulli et al. | 331/57 |
| 5,486,796 | 1/1996 | Ishikawa et al. | 331/117 R |
| 5,629,652 | 5/1997 | Weiss | 331/177 V |
| 5,914,513 | 6/1999 | Shenai et al. | 257/312 |

MIS TRANSISTOR VARACTOR DEVICE AND OSCILLATOR USING SAME

TECHNICAL FIELD OF INVENTION

The present invention relates to varactors and, in particular, to varactors suitable for integration. This kind of varactors is found, for example, in Voltage Controlled Oscillators and Phase Locked Loop circuits which, in their turn, are often used in radio communication devices. The present invention also relates to the manufacturing of such devices.

BACKGROUND

A varactor is an electrical device having a capacitance which is controlled by a suitable voltage or current bias. A varactor is used, for example, in Voltage Controlled Oscillators, VCOs, where a frequency of an oscillator is controlled by an applied voltage or current bias. VCOs are used, for example, when a variable frequency is required or when a signal needs to be synchronised to a reference signal. In radio communication devices, e.g. portable/cellular phones, VCOs are often used in Phase Locked Loop, PLL, circuits to generate suitable signals. Generation of a reference signal which is synchronised with a signal received by a radio receiver, modulation/demodulation operations and frequency synthesis are examples of such uses. Several varactors suitable for Integrated Circuit, IC, technologies are known in the prior art. R. A. Moline and G. F. Foxhall discuss in "Ion-Implanted Hyperabrupt Junction voltage Variable Capacitors", IEEE Trans. Electron Devices, ED-19, pp. 267f, 1972, the use of pn-diodes as varactors which may be used in bipolar, CMOS or BiCMOS technologies. It is also known to use Schottky diodes or MOS-diodes as varactors. The latter is described, for example, by S. M. Sze in "Physics of Semiconductor Devices" John Wiley & Sons, $2^{nd}$ Edition, pp. 368f. The integration of the known varactors depends on the capability of the IC technology. An overview of the integrated devices for high frequency RF application in a BiCMOS process is given by J. N. Burghartz, M. Soyuer and K. Jenkins in "Integrated RF and Microwave Components in BiCMOS Technology", IEEE Trans. Electron Devices, Vol. 43, pp. 1559–1570, Sept. 1996. As is stated on page 1568 and in FIG. 12 the varactors are not a part of the standard BiCMOS device set. Instead it is proposed to use a collector-base junction of a bipolar transistor as a varactor. J. Craninckx and M. S. J. Steyaert suggest in "A 1.8-GHz Low-Phase-Noise CMOS VCO Using Optimized Hollow Spiral Inductors", IEEE J. Solid-State Circuits, Vol. 32, pp. 736–744, May 1997, the use of a p+/n-well junction diode as a varactor in a VCO which is integrated by means of a CMOS process.

Whilst the known forms of varactors described above functions quite adequately, they do have a number of disadvantages.

One drawback of the known varactors is that they are difficult to realise with high quality factors, Q, especially for high frequency applications in a conventional CMOS process due to their high series resistance or required additional manufacturing steps. This results in low yield and high manufacturing costs.

Another drawback of the known pn-junction varactors is that in many applications, such as when used in most VCO circuits, a DC de-coupling capacitor needs to be added to the design which makes the design even more difficult to integrate into an IC. The use of a DC de-coupling capacitor externally to the IC adds on to the overall cost of the implementation and consumes valuable space on a Printed Circuit Board, PCB. These drawbacks become even more pronounced in hand-held devices, such as portable phones, which need to be small and which are produced in high-volumes.

It is an object of the present invention to provide a varactor which overcomes or alleviates the above mentioned problems.

SUMMARY OF THE INVENTION

The above mentioned problems are overcome or alleviated by providing an electrical device having a voltage dependent capacitance comprising a first region of a semiconductor material, and a second region and a third region of a semiconductor material formed in the first region, the second and third regions being separated by a separation region, and an electrically insulating layer formed on the first region at least at a region corresponding to the separation region, and a substantially conductive element formed on the insulating layer at least at a region corresponding to the separation region such that the insulating layer electrically insulates the substantially conductive element from the first, second and third regions, and a first electrode connected to the substantially conductive element, and a second electrode connected to the second and third regions.

In a preferred embodiment of the present invention an electrical device having a voltage dependent capacitance is provided by using the gate of a MOS transistor as a first electrode of the device and by connecting the drain and the source in common to form a second electrode.

The problems of the prior art are overcome by providing a electrical device having a voltage dependent capacitance which may be implemented by the use of a conventional CMOS process. Furthermore, since the insulating layer (in the case of a MOS transistor: an oxide layer) separates the substantially conductive element connected to the first electrode (in the case of a MOS transistor: the gate) from the second and third regions connected to the second electrode (in the case of a MOS transistor: the drain/source) the device may be used, for example in a VCO circuit, without the need for a DC de-coupling capacitor.

The present invention also provides a VCO, a PLL and a radio communication device making use of a varactor as discussed above. Furthermore, a method of manufacturing a varactor according to the present invention is provided.

An advantage of the present invention is that a varactor having a high quality factor, Q, i.e. with low series resistance, may be realised even for high frequency applications by using a conventional CMOS process without adding any manufacturing steps. The varactors may therefore be manufactured at high yield and to low costs.

Furthermore, an advantage of the present invention is that a VCO is provided which may be realised by using a conventional CMOS process and which does not need a DC de-coupling capacitor in the design. This makes the implementation of the VCO inexpensive and physically small since no DC de-coupling capacitor is needed neither on the IC nor externally to the IC on a PCB. These advantages become even more pronounced when implemented in hand-held devices, such as portable phones, which need to be small and which are produced in high-volumes.

Advantageously, the present invention provides an integrated Voltage Controlled Oscillator and/or Phase Locked Loop, PLL, circuit, which include a varactor as discussed above, by using a conventional CMOS process. Since many of the functions of a radio communication device may be integrated by conventional CMOS processes, the integration of a VCO and/or a PLL circuits together with these functions allows the present invention to provide a radio communication device with a high degree of integration and thus small physical dimensions. The high degree of integration also reduces the manufacturing costs.

DETAILED DESCRIPTION OF EMBODIMENTS

Embodiments of the present invention are described below, by way of example only. It should be noted that details illustrated in the figures may not be drawn to scale. On the contrary, the dimensions of the details of the illustrations are chosen so as to improve the understanding of the present invention.

According to the present invention there is provided an electrical device having a voltage dependent capacitance. Such a device is also called a varactor. It will be appreciated that the varactor of the present invention may easily be integrated in a conventional CMOS process.

Figure 1:
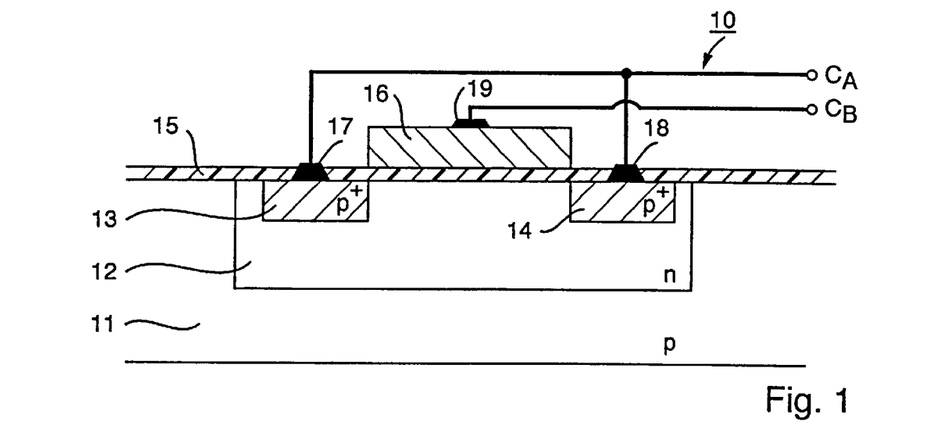
FIG. 1 illustrates a varactor according to a first embodiment of the present invention comprising a PMOS enhancement transistor.

FIG. 1 illustrates a varactor 10 according to a first embodiment of the present invention comprising a p-MOS enhancement transistor. The transistor is formed in a p-type silicon substrate 11. An n-type well 12 is formed in the p-type silicon substrate 11 from a first principal surface of the substrate and a p$^+$-type source region 13 and a p$^+$-type drain region 14 are formed in the n-type well 12. The impurity concentration of the source and drain regions 13, 14 is chosen to be greater than the impurity concentration of the well region 12. Thereafter an insulating layer 15, preferably of silicon oxide, is formed on the first principal surface of the substrate and a poly-silicon gate 16 is formed on the insulating layer 15 at least covering a part of the n-well region 12 separating the source region 13 and the drain region 14 and such that the gate 16 is electrically insulated from the n-well region 12. A common electrode $C_A$ of the varactor 10 is formed by connecting the source region 13 to the drain region 14. Connection is made to the source region 13 and the drain region 14 by means of a source electrode 17 and a drain electrode 18, respectively. A second electrode $C_B$ of the varactor 10 is connected to the gate 16 by means of a gate electrode 19.

Figure 2:
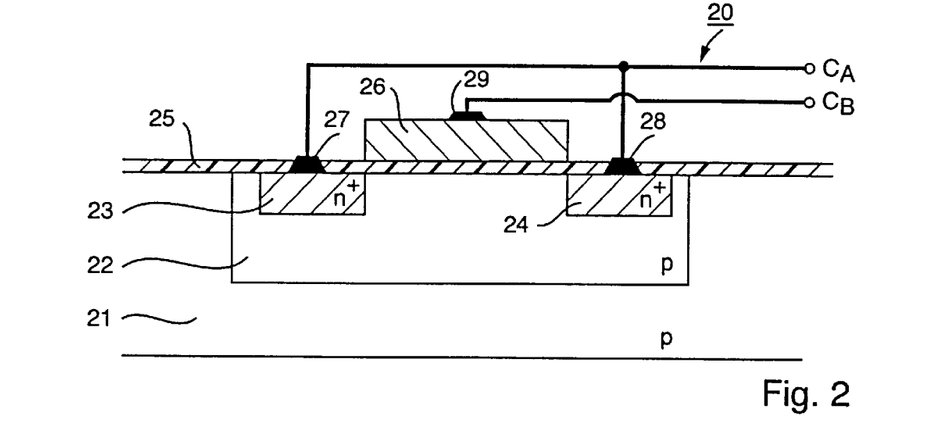
FIG. 2 illustrates a varactor according to a second embodiment of the present invention comprising a NMOS enhancement transistor.

FIG. 2 illustrates a varactor 20 according to a second embodiment of the present invention comprising a NMOS enhancement transistor. The transistor is formed in a p-type silicon substrate 21. A p-type well 22 is formed in the p-type silicon substrate 21 from a first principal surface of the substrate and an n$^+$-type source region 23 and an n$^+$-type drain region 24 are formed in the p-type well 22. The impurity concentration of the source and drain regions 23, 24 is chosen to be greater than the impurity concentration of the well region 22. Thereafter an insulating layer 25, preferably of silicon oxide, is formed on the first principal surface of the substrate and a poly-silicon gate 26 is formed on the insulating layer 25 at least covering a part of the p-well region 22 separating the source region 23 and the drain region 24 and such that the gate 26 is electrically insulated from the p-well region 22. A common electrode $C_A$ of the varactor 20 is formed by connecting the source region 23 to the drain region 24. Connection is made to the source region 23 and the drain region 24 by means of a source electrode 27 and a drain electrode 28, respectively. A second electrode $C_B$ of the varactor 20 is connected to the gate 26 by means of a gate electrode 29.

Figure 3:
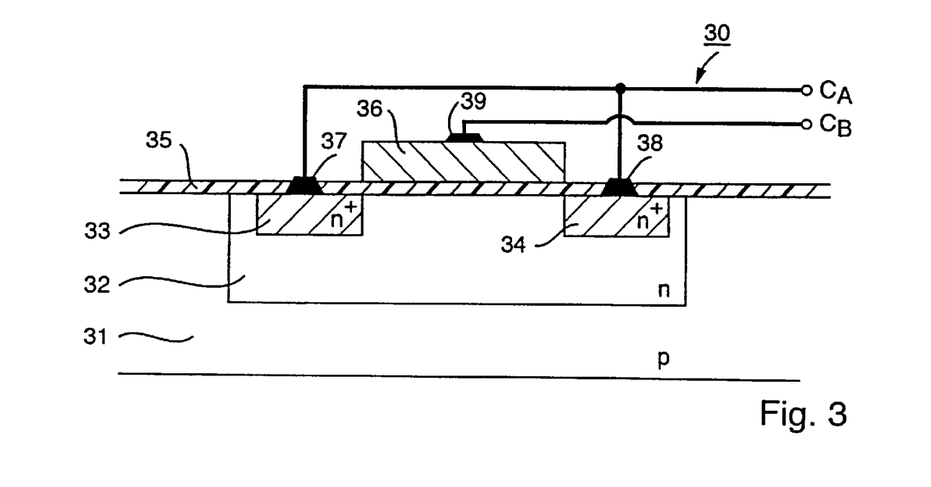
FIG. 3 illustrates a varactor according to a third embodiment of the present invention comprising a NMOS depletion transistor.

FIG. 3 illustrates a varactor 30 according to a third embodiment of the present invention comprising a NMOS depletion transistor. The transistor is formed in a p-type silicon substrate 31. An n-type well 32 is formed in the p-type silicon substrate 31 from a first principal surface of the substrate and an n$^+$-type source region 33 and an n$^+$-type drain region 34 are formed in the p-type well 32. The impurity concentration of the source and drain regions 33, 34 is chosen to be greater than the impurity concentration of the well region 32. Thereafter an insulating layer 35, preferably of silicon oxide, is formed on the first principal surface of the substrate and a poly-silicon gate 36 is formed on the insulating layer 35 at least covering a part of the n-well region 32 separating the source region 33 and the drain region 34 and such that the gate 26 is electrically insulated from the n-well region 32. A common electrode $C_A$ of the varactor 30 is formed by connecting the source region 33 to the drain region 34. Connection is made to the source region 33 and the drain region 34 by means of a source electrode 37 and a drain electrode 38, respectively. A second electrode $C_B$ of the varactor 30 is connected to the gate 36 by means of a gate electrode 39.

More generally the varactor can be defined as having a first region 12, 22, 32 of a semiconductor material in which a second region 13, 23, 33 and a third region 14, 24, 34 of a semiconductor material is formed. The second and third regions are separated by a separation region. An electrically insulating layer 15, 25, 35 is formed on the first region 12, 22, 32 at least at a region corresponding to the separation region. Thereafter, a substantially conductive element 16, 26, 36 is formed on the insulating layer 15, 25, 35 at least at a region corresponding to the separation region such that the insulating layer 15, 25, 35 electrically insulates the substantially conductive element 16, 26, 36 from the first, second and third regions. The substantially conductive element 16, 26, 36 is connected to an 35 electrode $C_B$ and the second and third regions are connected to a common electrode $C_A$.

It should be noted that the present invention is not limited to the use of semiconductor materials of silicon. Other semiconductor materials, e.g. GaAs, may be used instead. Furthermore, other materials than silicon oxide, e.g. silicon nitride or a combination of silicon oxide and silicon nitride, may be used to form the insulating layer 15, 25, 35. In those cases it is more appropriate to refer to Metal-Insulator-Semiconductor, MIS, transistors instead of Metal-Oxide-Semiconductor, MOS, transistors.

Although source electrodes 17, 27, 37 drain electrodes 18, 28, 38 and gate electrodes 19, 29, 39 are included in the embodiments discussed above, it should be understood that the present invention is not limited to the use of such electrodes. Instead the source region, the drain region and the gate may be connected by other means. For example, poly-silicon may be used for achieving a suitable connection to the gate and ion-implanted regions in the well-regions 12, 22, 32 or in the substrate 11, 21, 31 may be used to connect the source region 13, 23, 33 and the drain region 14, 24, 34. A combination of different methods of connection may be used for one and the same varactor.

Figure 4:
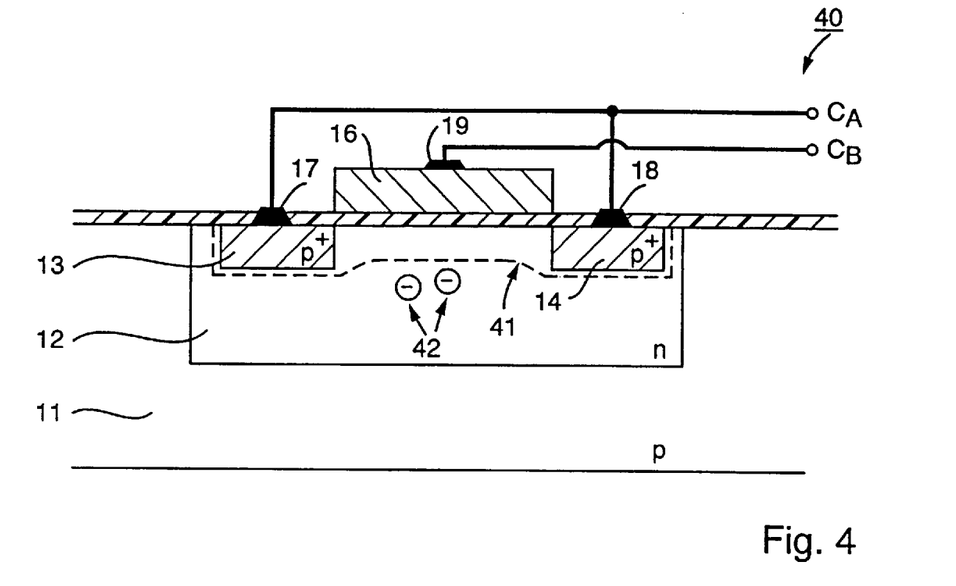
FIG. 4 illustrates an operational aspect of the first embodiment of the present invention.
Figure 5:
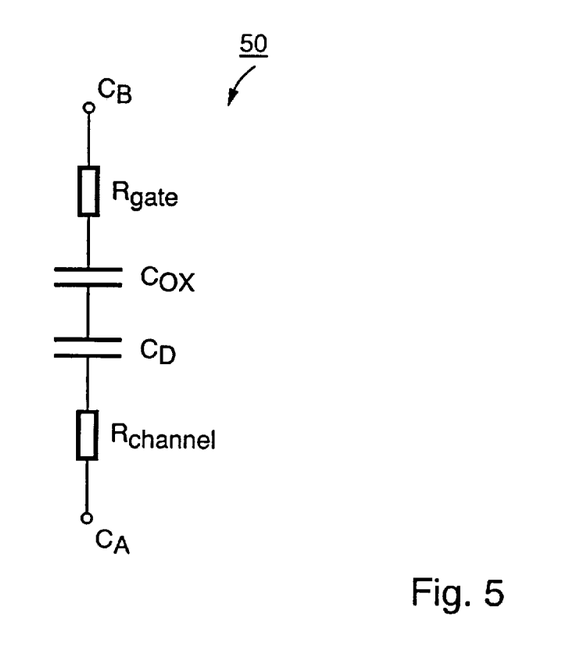
FIG. 5 illustrates an equivalent circuit diagram of the first embodiment of the present invention.

FIG. 4 illustrates an operational aspect of the first embodiment of the present invention. The varactor 40 corresponds to the varactor 10 of FIG. 1 and FIG. 5 illustrates an equivalent circuit diagram of the varactor 40. In operation, a voltage is applied between the electrodes $C_A$ and $C_B$ such that the potential at $C_A$ is greater than the potential at $C_B$. The surface region of the well region 12 is then depleted and the depletion width is illustrated in FIG. 4 by a depletion boundary 41. The capacitance of the varactor will, inter alia, be dependent on the series combination of the oxide capacitance $C_{ox}$, or corresponding capacitance if the insulating layer is not made up of an oxide, and the semiconductor depletion layer capacitance $C_D$. The depletion layer capacitance $C_D$ will, in its turn, be dependent on the potential of the well and on the voltage applied over the device, i.e. between the source/drain and the gate. A high dynamic range of the varactor is achieved by making the well region as lightly doped as possible at the principle surface region by, for example, blocking the threshold implantation of the CMOS process. A high Q factor of the varactors is also achieved by keeping the electrical resistance of the gate $R_{gate}$ (and its connection) and the electrical resistance $R_{channel}$ in the well region 12 between the source region 13 and the drain region 14 as small as possible. The electrical resistance of a poly-silicon gate may be decreased by including a step for siliciding the gate. The electrical resistance experienced by the minority charge carriers 42 in the well region 12 may be reduced by using small dimensions of the gate and the channel region. Small dimensions of the gate and the channel region do, however, give rise to a varactor having a capacitance with a sometimes unacceptable small numerical value. This problem is solved by connecting a suitable number of varactors in parallel to form a composite varactor. The connections between the varactors are preferably carried out by means of a low resistance material, such as aluminium, to keep the resistance between the devices low and thereby achieving an overall high Q factor of the composite varactor.

As mentioned above, the depletion layer capacitance $C_D$ is also dependent on the potential of the well and, consequently, the device may also be operated by applying fixed potentials to the electrodes $C_A$ and $C_B$ and controlling the capacitance of the device by a suitable voltage applied to the well. Alternatively, a fixed potential is applied to one of the electrodes $C_A$ or $C_B$ the other electrode is connected to the well and the device is controlled by a suitable voltage applied to the well.

The operational aspects of the first embodiment discussed above applies also to the second and third embodiments after appropriate adaptations to the applied polarities according to principles well known in the art.

Although the first, second and third embodiments discussed above all makes use of a p-type semiconductor substrate, n-type semiconductor substrate may be used equally well if polarities and conductivity-types are adapted according to well known principles in the art.

In a conventional 0.25 µm or 0.35 µm CMOS process the gate length $L_g$, corresponding substantially to the distance between the source region and the drain region, is preferably chosen to be less than 2 µm and most preferably less than 1 µm. The gate width $W_g$ is preferably chosen to be less than 20 µm, e.g. 15 µm, 10 µm or 5 µm. In the case where a low resistance gate material, such as metal silicided poly-silicon, is used the gate width may be chosen to be less than 6 µm.

Figure 6:
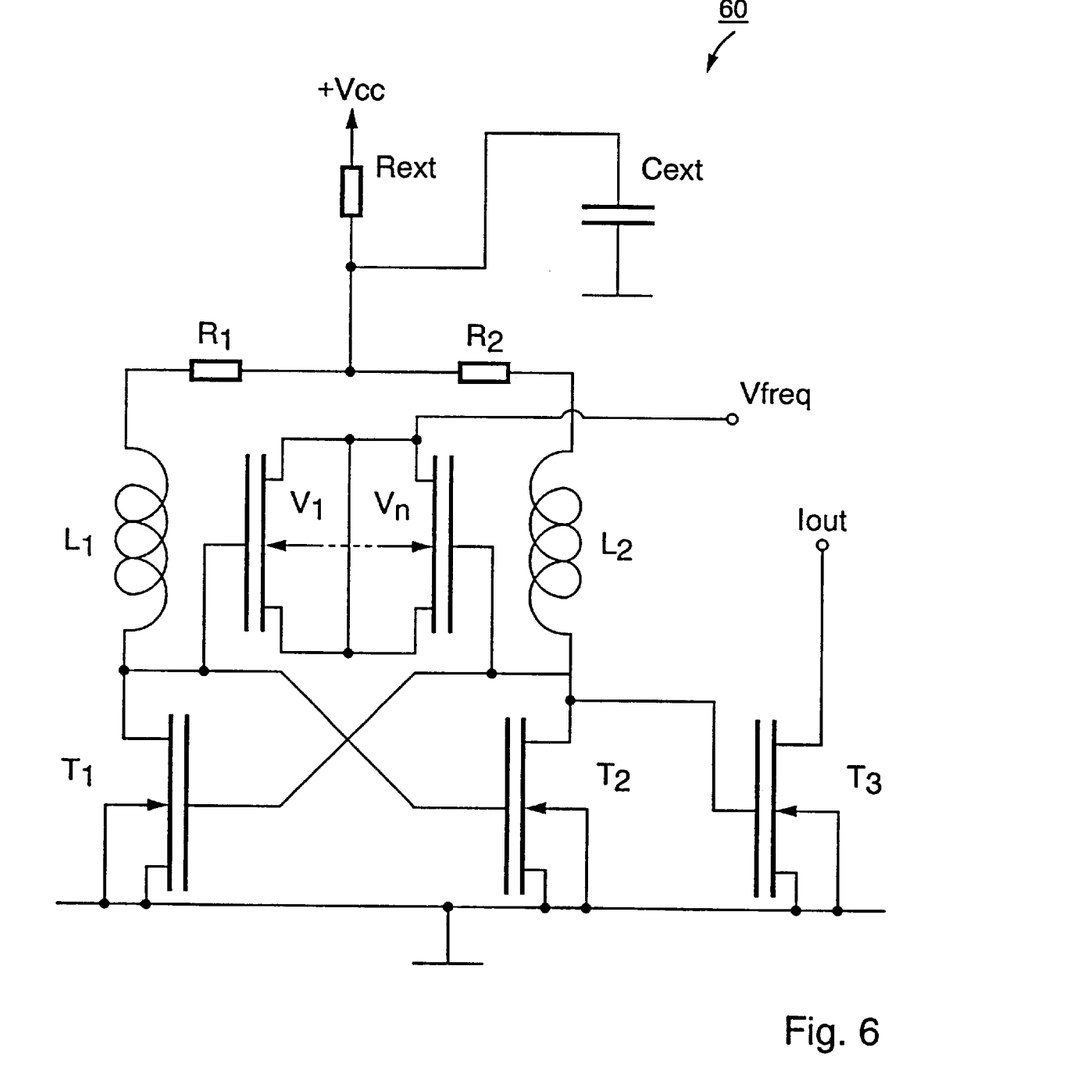
FIG. 6 illustrates a circuit diagram of a Voltage Controlled Oscillator according to a fourth embodiment of the present invention.

FIG. 6 illustrates a circuit diagram of a Voltage Controlled Oscillator 60 according to a fourth embodiment of the present invention. The bulks and the sources of a first, a second and a third NMOS enhancement transistor, $T_1$, $T_2$, and $T_3$, respectively, are connected to ground potential. The gate of the first transistor $T_1$ is connected to the drain of the second transistor $T_2$ and to the gate of the third transistor $T_3$. The gate of the second transistor $T_2$ is connected to the drain of the first transistor $T_1$ and to a first electrode of first inductor $L_1$. A second electrode of the first inductor $L_1$ is connected to a first electrode of a first resistor $R_1$.

The drain of the second transistor $T_2$ is connected to a first electrode of a second inductor $L_2$. A second electrode of the second inductor is connected to a second resistor $R_2$. A second electrode of the first resistor $R_1$ is connected to a second electrode of the second resistor $R_2$, to a first electrode of a third resistor $R_{ext}$ and to a first electrode of a first capacitor $C_{ext}$. A second electrode of the third resistor $R_{ext}$ is connected to a supply voltage $+V_{cc}$ and a second electrode of the first capacitor $C_{ext}$ is connected to ground potential. The circuit further comprises at least two varactors $V_1$–$V_n$ where n is the number of varactors. A first composite varactor is formed by coupling a predetermined number of the varactors $V_1$–$V_n$ in parallel and a second composite varactor is formed by connecting the remaining varactors in parallel. An input connection for receiving a voltage $V_{freq}$ which controls the frequency of the Voltage Controlled Oscillator is connected to a first electrode of each of the first and second composite varactors. A second electrode of the first composite varactor is connected to the drain of the first transistor $T_1$ and a second electrode of the second composite varactor is connected to the drain of the second transistor $T_2$. In this embodiment, the varactors $V_1$–$V_n$ are made up of NMOS depletion transistors. The first electrodes of the composite varactors is constituted by a common connection between the bulk and all the source regions and drain regions of the NMOS depletion transistors. The second electrode of the first composite varactor is constituted by a common connection between the gates of the NMOS depletion transistors of the first composite varactor and the second electrode of the second composite varactor is constituted by a common connection between the gates of the NMOS depletion transistors of the second composite varactor. The gates of the NMOS depletion transistors are preferably connected to the VCO circuit, and not to the input connection for receiving a voltage $V_{freq}$, since the gate has a low parasitic capacitance. The output signal $I_{out}$ of the VCO is obtained at the drain of the third transistor $T_3$. Optionally the third resistor $R_{ext}$ and the first capacitor $C_{ext}$ are not integrated on the chip. Furthermore, it is possible to implement the first and second inductors $L_1$, $L_2$ by making use of the inductance of bonding wires of the IC. It should be noted that the bulk of the MOS transistors making up the composite varactors $V_1$–$V_n$ may be connected to a different potential than $V_{freq}$, e.g. zero potential, as long as the bulk does not form a forward biased diode with any other regions of the transistors. The operation of the VCO circuit, as such, is well known in the art.

The best performance for a given VCO circuit with given inductors is determined by the Q factor and the dynamic range (minimum and maximum capacitance value) of the (composite) varactors. According to the fourth embodiment of the present invention NMOS transistors are used. These give the lowest parasitic resistance and thus the highest Q factor. The threshold voltage is adjusted such as to give the largest dynamic range of the (composite) varactors as is possible within a pre-determined (voltage) bias range.

In the case where the varactors of the present invention are integrated in a conventional CMOS process together with other devices the source and drain regions need to be insulated from the substrate, for example by forming the varactor in at least one well region. Although a high dynamic range of the varactors is achieved by making the well region as lightly doped as possible at the principal surface region by, for example, blocking the threshold implantation of the CMOS process, this is not always necessary and, in those cases, conventional MOS transistors may be used. It should be noted that the integration of the varactor of the present invention may also be carried out in older CMOS processes where only one well region having a conductivity type opposite to the conductivity type of the substrate is available.

Advantageously, the present invention provides an integrated Voltage Controlled Oscillator and/or Phase Locked Loop, PLL, circuit (not shown), which include a varactor as discussed above, by using a conventional CMOS process. A PLL is often used in radio communication devices (not shown), such as portable/cellular phones, for synchronising signals with reference signals possibly received by means of a radio receiver and for generating desirable frequencies in a frequency synthesiser. Since many of the functions of a radio communication device may be integrated by conventional CMOS processes, the integration of a VCO and/or a PLL circuits together with these functions allows the present invention to provide a radio communication device with a high degree of integration and thus small physical dimensions. The high degree of integration also reduces the manufacturing costs.

Two more embodiments of (composite) varactors are presented below to illustrate that the electrical devices of the present invention may be implemented in a large number of ways without departing from the scope of the present invention.

Figure 7:
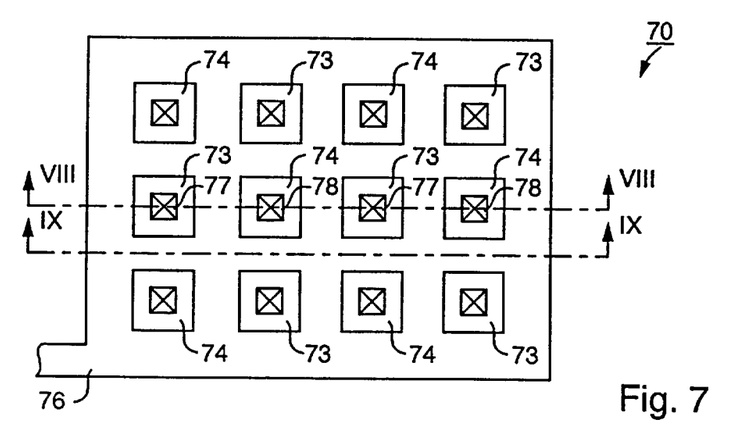
FIG. 7 illustrates a top-view of a composite varactor according to a fifth embodiment of the present invention.
Figure 8:
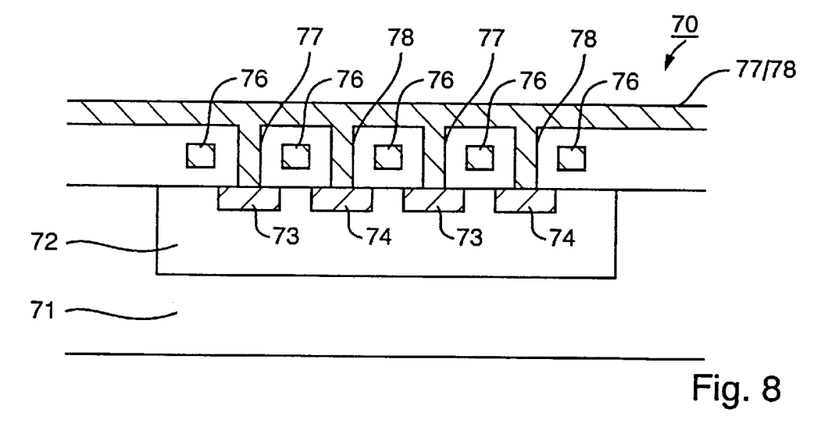
FIG. 8 illustrates a cross-section view along the axis VIII—VIII of FIG. 7.
Figure 9:
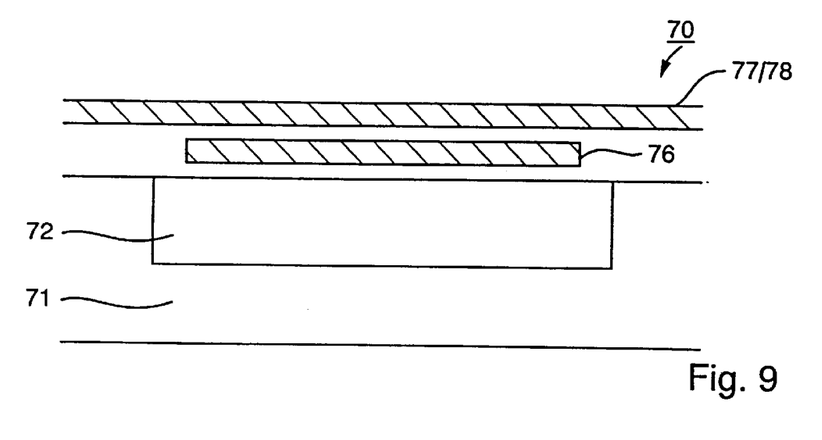
FIG. 9 illustrates a cross-section view along the axis IX—IX of FIG. 7.

FIG. 7 illustrates a top-view of a composite varactor 70 according to a fifth embodiment of the present invention. Furthermore, FIG. 8 and FIG. 9 illustrate cross-section views along the axes VIII—VIII and IX—IX, respectively, of FIG. 7. An n-type well region 72 is formed in a p-type substrate 71. $P^+$-type regions 73, 74 are formed in the well region 72 so as to form equally spaced islands in a two-dimensional matrix. A gate 76, separated from the well and the semiconductor substrate by an insulating layer (not shown), is formed at regions corresponding to regions between the $p^+$-type regions 73, 74. Preferably, but not necessarily, the gate 76 also extends such that all $p^+$-type regions are surrounded by the gate. The gate 76 forms a first electrode of the composite varactor 70. All $p^+$-type regions 73, 74 are connected in common by means of a second layer of poly-silicon 77/78 and connecting elements 77, 78 forming a second electrode of the composite varactor 70. The $p^+$-type regions 73, 74 make up the source regions 73 and the drain regions 74 such that the closest regions to each source region 73 are drain regions 74 and vice versa.

In an example of a method of manufacturing the composite varactor 70 of the fifth embodiment the n-type well region 72 is first formed in the p-type semiconductor substrate 71. An insulating layer (not shown) is formed on the surface of the well region and a first poly-silicon layer is formed thereon. A first mask layer (not shown) is formed on the first poly-silicon layer. The first mask layer is exposed and etched to adopt a grid-shaped form (not shown). Next, the first poly-silicon layer is etched to form the gate 76. The gate 76 consequently adopts the grid-shaped form of the mask. The gate 76 forms the first electrode of the composite varactor. The remainder of the mask is removed and the $p^+$-type source regions 73 and the $p^+$-type drain regions 74 are formed by ion-implantation using the gate 76 as a mask. During this process the conductivity of the gate 76 will increase due to the ion-implantation of the gate. Alternatively, the mask is kept during the ion-implantation. Preferably, the conductivity of the gate is increased by having the gate 76 metal silicided. An insulating layer (not shown) is formed over the structure and a second mask layer (not shown) is formed thereon. The second mask layer is exposed and etched to form a mask (not shown) having openings over each of the source regions 73 and drain regions 74. Next, the insulating material in regulation with the openings will be removed in an etching step. The second mask is then removed and the second poly-silicon layer 77/78 is formed thereon. It should be noted that due to the previous etching step the second poly-silicon layer will connect to each of the source regions 73 and drain regions 74 by means of poly-silicon connecting elements 77 and 78, respectively. Thereby, the second poly-silicon layer 77/78 forms the second electrode of the composite varactor. In an alternative embodiment poly-silicon is used to form the connecting elements 77, 78 and a metal electrode is used, instead of the poly-silicon layer 77/78, to connect the connecting elements 77, 78 in common.

The device of the fifth embodiment can be considered as made up of a number of MOS transistors, each having a source region 73, a drain region 74, a gate 76 and a channel region formed between the source region 73 and the drain region 74, which are coupled in parallel by means of the second poly-silicon layer to form a composite varactor. The operation of each of the MOS transistors will therefore correspond to the operation of the varactors comprising a MOS transistor as discussed above.

Figure 10:
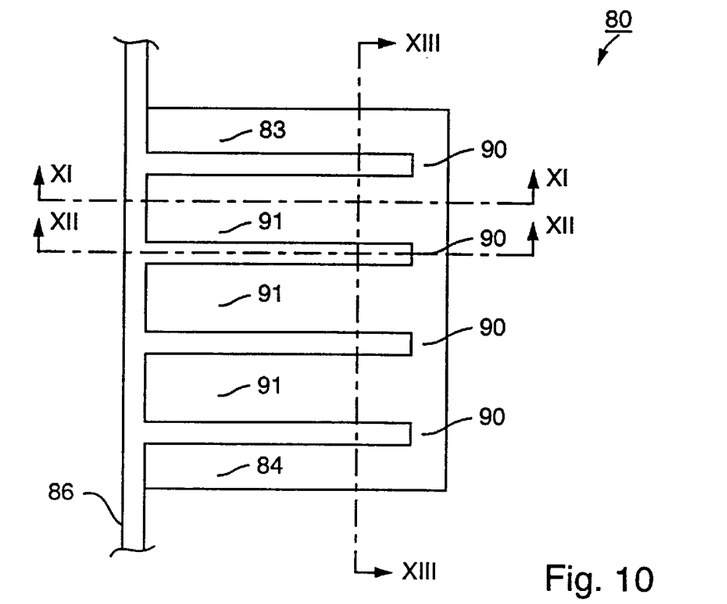
FIG. 10 illustrates a top-view of a composite varactor according to a sixth embodiment of the present invention.
Figure 11:
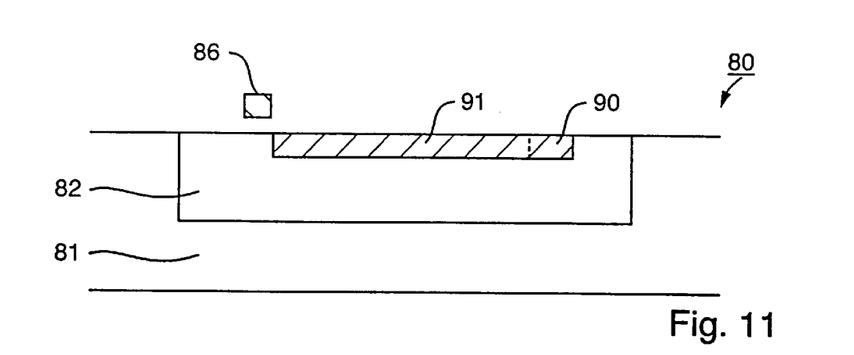
FIG. 11 illustrates a cross-section view along the axis XI—XI of FIG. 10.
Figure 12:
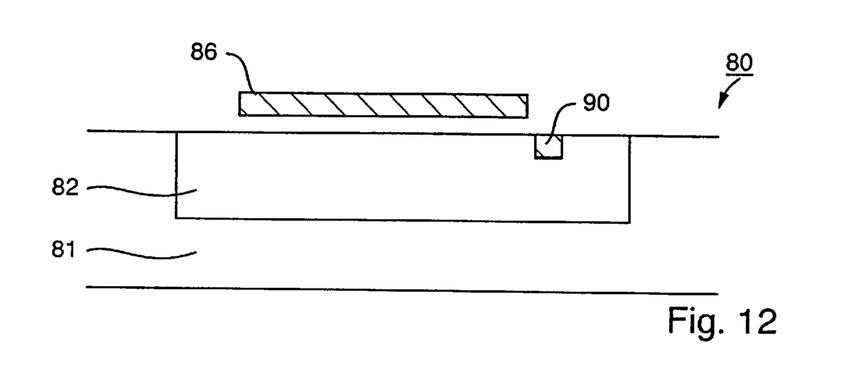
FIG. 12 illustrates a cross-section view along the axis XII—XII of FIG. 10.
Figure 13:
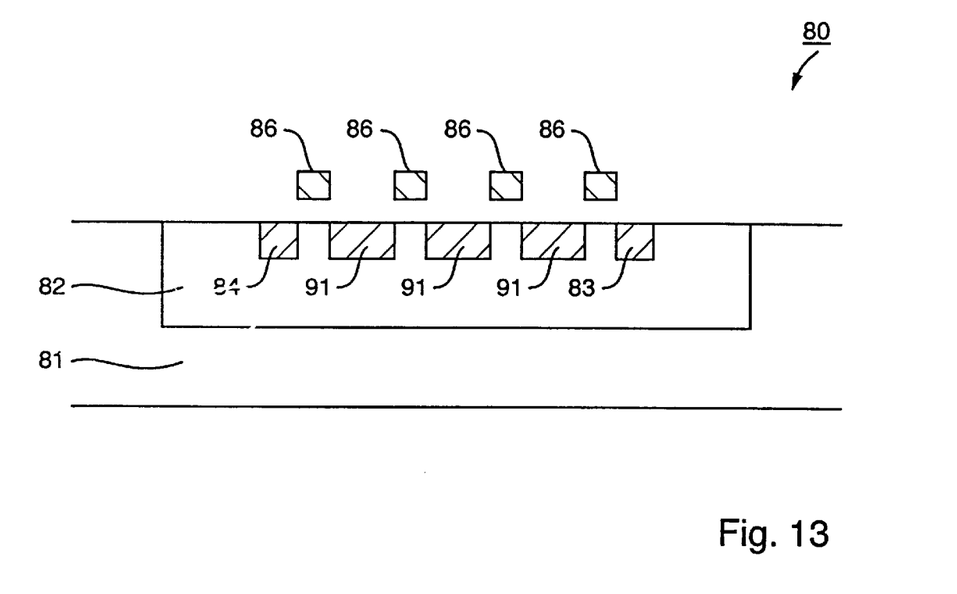
FIG. 13 illustrates a cross-section view along the axis XIII—XIII of FIG. 10.

FIG. 10 illustrates a top-view of a composite varactor 80 according to a sixth embodiment of the present invention. Furthermore, FIG. 11, FIG. 12 and FIG. 13 illustrate cross-section views along the axes XI—XI, XII—XII and XIII—XIII, respectively, of FIG. 10. An n-type well region 82 is formed in a p-type substrate 81. A $p^+$-type region 83, 91, 84, 90 having a comb-shaped form is formed in the well region 82. A gate 86, separated from the substrate 81 and the well region 82 by an insulating layer (not shown), is formed at regions corresponding to the regions between the "fingers" of the comb-shaped $p_+$-type region 83, 91, 84, 90. The gate 86 also extends along the edges of the "fingers" such that one common gate 86 is formed. The gate 86 forms a first electrode of the composite varactor 80 and the $p^+$-type region 83, 91, 84, 90 is connected to a second electrode (not shown) of the composite varactor 80.

In an example of a method of manufacturing the composite varactor 80 of the sixth embodiment the n-type well region 82 is formed in the p-type semiconductor substrate 81. An insulating layer (not shown) is formed on the surface of the well region and a poly-silicon layer is formed thereon. A first mask layer (not shown) is formed on the poly-silicon layer. The first mask layer is exposed and etched to form a first mask (not shown) having a comb-shaped form. Next, the poly-silicon layer is etched to form the gate 86. The gate 86 consequently adopts the comb-shaped form of the mask. The gate 86 forms a first electrode of the composite varactor. The remainder of the mask is removed and a second mask layer (not shown) is formed on the structure. The second mask layer is exposed and etched to form a second mask (not shown) with an opening such that the "fingers" of the comb-shaped gate and an area surrounding the "fingers" are not covered by the mask. Thereafter, a p$^+$-type source region 83, combined p$^+$-type source and drain regions 91, a drain region 84 and connection regions 90 for connecting these regions are formed by ion-implantation using not only the second mask but also the gate 86 as a mask. During this process the conductivity of the gate 86 will increase due to the ion-implantation of the gate. Alternatively, the first mask is kept during the ion-implantation. Preferably, the conductivity of the gate is increase by having the gate 86 metal silicided. The ion-implanted regions 83, 91, 84 and 90 are connected and this connection forms a second electrode of the composite varactor.

The device of the sixth embodiment can be considered as made up of a number of MOS transistors, each having a source region 91 (or 83), a drain region 91 (or 84) a gate 86 and a channel region formed between the source region and the drain region, which are coupled in parallel by means of the connection regions 90 to form a composite varactor. The operation of each of the MOS transistors will therefore correspond to the operation of the varactors comprising a MOS transistor as discussed above. In an alternative embodiment (not shown) the gate 86 is formed (at least temporary during the manufacturing) such that it also performs the function of the second mask and, hence, no second mask is needed to define the regions which are to be ion-implanted 83, 91, 84 and 90 in the steps that follow.

The composite varactors (70, 80) of the fifth and sixth embodiments show examples of devices having a number of varactors coupled in parallel. As discussed above, a high Q factor of each varactor can be achieved by using small dimensions of the gate and the channel region and by keeping the resistance of the gate (and its connection) as small as possible. Small dimensions of the gate and the channel region do, however, give rise to a varactor having a capacitance with a sometimes unacceptable small numerical value. A suitable capacitance of a composite varactor, e.g. the composite varactors of the fifth and sixth embodiments (70, 80), is therefore achieved by coupling a suitable number of varactors in parallel. Composite varactors having high Q factors and suitable capacitances are thereby provided.

It should be noted that although the devices of the fifth and sixth embodiments have been illustrated by means of their method of manufacturing, other methods of manufacturing which may be contemplated by the man skilled in the art may be used without departing from the scope of the present invention. Furthermore, it is obvious that a device with any number of MOS transistors coupled together may be formed.

An advantage of the present invention is that varactors having high quality factors, Q, i.e. with low series resistance, may be realised even for high frequency applications by using a conventional CMOS process without adding any manufacturing steps. The varactors may therefore be manufactured at high yield and to low costs.

Furthermore, an advantage of the present invention is that a VCO is provided which may be realised by using a conventional CMOS process and which does not need the addition of a DC de-coupling capacitor to the design. This makes the implementation of the VCO inexpensive and physically small since no DC de-coupling capacitor is needed neither on the IC nor externally to the IC on the PCB. These advantages become even more pronounced when implemented in hand-held devices, such as portable phones, which need to be small and which are produced in high-volumes.

What is claimed is:

1. An electrical device having a voltage dependent capacitance comprising:
    a first region of a semiconductor material;
    a second region and a third region of a semiconductor material formed in the first region, the second and third regions being separated by a separation region;
    an electrically insulating layer formed on the first region at least at a region corresponding to the separation region;
    a substantially conductive element formed on the insulating layer at least at a region corresponding to the separation region such that the insulating layer electrically insulates the substantially conductive element from the first, second and third regions;
    a first electrode connected to the substantially conductive element; and
    a second electrode connected to the second and third regions, wherein only a variable voltage between said first electrode and said second electrode are utilized to adjust said voltage dependant capacitance of said electrical device.

2. An electrical device according to claim 1 wherein the second region, the third region and the substantially conductive element constitutes the drain, source and gate, respectively, of a MIS transistor.

3. An electrical device according to claim 2 wherein the gate length is less than 2 $\mu$m.

4. An electrical device according to claim 3 wherein the gate length is approximately 1 $\mu$m.

5. An electrical device according to claim 1 wherein the substantially conductive element comprises poly-silicon.

6. An electrical device according to claim 1 wherein the substantially conductive element comprises metal silicide.

7. An electrical device according to claim 2 wherein the gate width is less than 5 $\mu$m.

8. An electrical device according to claim 2 wherein the gate width is less than 20 $\mu$m.

9. An electrical device according to claim 1 wherein the first region constitutes a well region in the semiconductor substrate and wherein a third electrode is connected to a semiconductor substrate.

10. An electrical device according to claim 9 wherein the third electrode is connected to either the first or the second electrode.

11. An electrical device according to claim 1, wherein the capacitance is measured between the first electrode and the second electrode.

12. A Voltage Controlled Oscillator (VCO) comprising:
    an input terminal for the application of an input voltage;
    an output terminal for the outputting of an oscillating signal with a frequency depending on the input voltage; and an electrical device having a voltage dependent capacitance comprising:

a first region of a semiconductor material;

a second region and a third region of a semiconductor material formed in the first region, the second and third regions being separated by a separation region;

an electrically insulating layer formed on the first region at least at a region corresponding to the separation region;

a substantially conductive element formed on the insulating layer at least at a region corresponding to the separation region such that the insulating layer electrically insulates the substantially conductive element from the first, second and third regions;

a first electrode connected to the substantially conductive element; and a second electrode connected to the second and third regions, said second electrode comprising at least one of a poly-silicon region and an ion-implanted region which connects said second and third regions.

13. The Voltage Controlled Oscillator (VCO) according to claim 12 wherein the VCO further comprises at least one MIS transistor having a drain connected to a source.

14. The Voltage Controlled Oscillator (VCO) according to claim 13 wherein the VCO comprises a first MIS transistor and a first inductor coupled to a first varactor and a second MIS transistor and a second inductor coupled to a second varactor, and wherein the drain of the first transistor is coupled to the gate of the second transistor and the drain of the second transistor is coupled to the gate of the first transistor.

15. The Voltage Controlled Oscillator (VCO) according to claim 14 wherein the first varactor comprises a first group of MIS transistors having their drains and sources connected in common and the second varactor comprises a second group of MIS transistors having their drains and sources connected in common.

16. The Voltage Controlled Oscillator (VCO) according to claim 15 wherein the gates of the transistors of the first group of transistors are connected in common and the gates of the transistors of the second group of transistors are connected in common.

17. The Voltage Controlled Oscillator (VCO) according to claim 13 wherein the drain source of the MIS transistor of the at least one varactor is coupled to the input terminal for the application of an input voltage to the VCO.

18. The Voltage Controlled Oscillator (VCO) according to claim 16 wherein the gates of the first group of transistors are coupled to the drain of the first MIS transistor and the gates of the second group of transistors are coupled to the drain of the second MIS transistor.

19. The Voltage Controlled Oscillator (VCO) according to claim 13 wherein the MIS transistors are MOS transistors.

20. A method of manufacturing an electrical device having a voltage dependent capacitance comprising the steps of:

forming a first semiconductor region;

forming a second region and a third region of a semiconductor material in the first region, the second and third regions being separated by a separation region;

forming an electrically insulating layer on the first region at least at a region corresponding to the separation region;

forming a substantially conductive element on the insulating layer at least at a region corresponding to the separation region such that the insulating layer electrically insulates the substantially conductive element from the first, second and third regions, said step of forming a substantially conductive element on the insulating layer including a step of siliciding so as to reduce the resistance of the formed substantially conductive element;

forming a first electrode electrically connected to the substantially conductive element; and forming a second electrode electrically connected to the second and third regions.

21. A method of manufacturing an electrical device according to claim 20 further comprising the steps of:

forming a blocking layer, for blocking a later MIS transistor threshold implantation step of an IC manufacturing process, at least at a region corresponding to the separation region.

22. A method of manufacturing an electrical device according to claim 21 wherein the IC manufacturing process is a CMOS process.

23. A semiconductor device having a voltage dependant capacitance comprising:

a first region of semiconductor material;

a second region and a third region of semiconductor material formed in said first region, said second region and said third region being separated by a separation region;

an electrically insulating layer formed on said first region, said electrically insulating layer covering said separation region;

a substantially conductive element formed on said insulating layer at least at a region corresponding to said separation region such that said insulating layer electrically insulates said substantially conductive element from said first, second and third regions;

a first conductive terminal connected to said substantially conductive element; and a second conductive terminal connected to both said second region and said third region, said voltage dependent capacitance being established between said first and second conductive terminals.

24. A semiconductor device having a voltage dependant capacitance comprising:

a first region of semiconductor material;

a second region and a third region of semiconductor material formed in said first region, said second region and said third region being separated by a separation region;

an electrically insulating layer formed on said first region, said electrically insulating layer completely covering said separation region;

a substantially conductive element having a minimized resistance due to having silicate incorporated therein in order to substantially maximize a Q of said semiconductor device, said substantially conductive element formed on said insulating layer at least at a region corresponding to said separation region such that said insulating layer electrically insulates said substantially conductive element from said first, second and third regions;

a first conductive terminal connected to said substantially conductive element; and a second conductive terminal connected to both said second region and said third region.

25. A semiconductor varactor device comprising:

a first region of semiconductor material;

a second region and a third region being formed in said first region, said second region and said third region being separated by a separation region and being electrically connected to each other;

an electrically insulating layer formed on said first region, said electrically insulating layer substantially covering said separation region; and a substantially conductive element formed on said insulating layer over said separation region such that said insulating region insulates said substantially conductive element from said first, second, and third regions;

said semiconductor varactor device providing a variable capacitance measured between said substantially conductive element and said second region, which is electrically connected to said third region, due to application of a variable voltage differential applied between said substantially conductive element and said second region.

26. The semiconductor varactor device of claim 25, wherein said second region and said third region are electrically connected to each other via a poly-silicon connecting element.

27. The semiconductor varactor device of claim 25, wherein said second region and said third region are electrically connected to each other via an ion-implanted connecting element.

28. The semiconductor varactor device of claim 25, wherein said semiconductor varactor device is a MIS transistor wherein said second region is a source and said third region is a drain of said MIS transistor.

29. A voltage controlled capacitance semiconductor device, comprising:

a first region of semiconductor material;

a second region of semiconductor material formed in said first region;

a third region of semiconductor material formed in said first region, said second region and said third region being spaced from each other thereby establishing a separation region there between;

connecting semiconductor means for connecting said second region to said third region, said connecting semiconductor means having a substantially low resistance;

an electrically insulating layer formed on said first region and covering said separation region; and a conductive element formed on top of said electrically insulating layer; said voltage controlled capacitance being measured between said connecting semiconductor means and said conductive element, said voltage controlled capacitance being controlled by a voltage differential between said connecting semiconductor means and said conductive element.

30. The voltage controlled capacitance semiconductor device of claim 29, wherein said connecting semiconductor means comprises an ion-implanted region.

31. The voltage controlled capacitance semiconductor device of claim 29, wherein said connecting semiconductor means comprises a poly-silicon region.

32. The voltage controlled capacitor semiconductor device of claim 29, wherein said capacitance is only controlled by said voltage differential between said connecting semiconductor means and said conductive element.

33. A semiconductor varactor device having a voltage dependent capacitance, said semiconductor varactor device comprising:

a first region of semiconductor material;

a second region and a third region of semiconductor material formed in the first region, the second and third regions being separated by a separation region;

an electrically insulating layer formed on the first region at least at a region corresponding to the separation region;

a substantially conductive element formed on the insulating layer at least at a region corresponding to the separation region such that the insulating layer electrically insulates the substantially conductive element from the first, second, and third regions;

a first electrode connected to the substantially conductive element;

a second electrode connected to the second and third regions, and a third electrode connected to said first region of semiconductor material, said semiconductor varactor device being adapted to accept a variable voltage between a selected two of said first electrode, said second electrode and said third electrode such that a capacitance between said selected two electrodes is dependant upon said variable voltage.

34. The semiconductor varactor device of claim 33, wherein said semiconductor varactor device is utilized in a voltage controlled oscillator circuit.

* * * * *